(12) United States Patent
Merchant et al.

(10) Patent No.: US 8,309,844 B2
(45) Date of Patent: Nov. 13, 2012

(54) THICK FILM PASTES FOR FIRE THROUGH APPLICATIONS IN SOLAR CELLS

(75) Inventors: Nazarali Merchant, San Diego, CA (US); Aziz S. Shaikh, San Diego, CA (US); Srinivasan Sridharan, Strongsville, OH (US)

(73) Assignee: Ferro Corporation, Cleveland, OH (US)

( * ) Notice: Subject to any disclaimer, the term of this patent is extended or adjusted under 35 U.S.C. 154(b) by 605 days.

(21) Appl. No.: 11/846,552

(22) Filed: Aug. 29, 2007

(65) Prior Publication Data

US 2009/0056798 A1   Mar. 5, 2009

(51) Int. Cl.
*H01L 31/00* (2006.01)
(52) U.S. Cl. ........ 136/256; 136/252; 136/265; 252/512; 252/513; 252/514; 252/515
(58) Field of Classification Search .................. 136/252, 136/256, 265; 252/500, 512–515
See application file for complete search history.

(56) References Cited

U.S. PATENT DOCUMENTS

| | | |
|---|---|---|
| 3,615,772 A | 10/1971 | Kohut |
| 4,152,282 A | 5/1979 | Baudry et al. |
| 4,220,547 A | 9/1980 | Abe et al. |
| 4,323,652 A | 4/1982 | Baudry et al. |
| 4,375,007 A | 2/1983 | Marcus |
| 4,379,319 A | 4/1983 | Wilson |
| 4,517,155 A | 5/1985 | Prakash et al. |
| 4,880,567 A | 11/1989 | Prabhu et al. |
| 4,906,406 A | 3/1990 | Hormadaly |
| 5,051,381 A | 9/1991 | Ohji et al. |
| 5,165,986 A | 11/1992 | Gardner et al. |
| 5,296,426 A | 3/1994 | Burn |
| 5,431,741 A | 7/1995 | Sakaguchi et al. |
| 5,439,852 A | 8/1995 | Hormadaly |
| 5,468,695 A | 11/1995 | Carroll et al. |
| 5,491,118 A | 2/1996 | Hormadaly |
| 5,543,333 A | 8/1996 | Holdermann |
| 5,641,362 A | 6/1997 | Meier |
| 5,753,571 A | 5/1998 | Donohue |
| 5,792,716 A | 8/1998 | Vasudevan et al. |
| 5,928,438 A | 7/1999 | Salami et al. |
| 5,948,536 A | 9/1999 | Suzuki et al. |
| 6,096,968 A | 8/2000 | Schlosser et al. |
| 6,143,976 A | 11/2000 | Endros |
| 6,171,987 B1 | 1/2001 | Hormadaly |
| 6,185,087 B1 | 2/2001 | Park et al. |
| 6,225,392 B1 | 5/2001 | Sunahara |
| 6,262,359 B1 | 7/2001 | Meier et al. |
| 6,673,274 B2 | 1/2004 | Venigalla et al. |

(Continued)

FOREIGN PATENT DOCUMENTS

WO   WO2007/117153   * 10/2007

*Primary Examiner* — Mark Kopec
*Assistant Examiner* — Haidung Nguyen
(74) *Attorney, Agent, or Firm* — Rankin, Hill & Clark LLP

(57) ABSTRACT

Formulations and methods of making solar cell contacts and cells therewith are disclosed. The invention provides a photovoltaic cell comprising a front contact, a back contact, and a rear contact. The back contact comprises, prior to firing, a passivating layer onto which is applied a paste, comprising aluminum, a glass component, wherein the aluminum paste comprises, aluminum, another optional metal, a glass component, and a vehicle. The back contact comprises, prior to firing, a passivating layer onto which is applied an aluminum paste, wherein the aluminum paste comprises aluminum, a glass component, and a vehicle.

12 Claims, 1 Drawing Sheet

U.S. PATENT DOCUMENTS

| | | |
|---|---|---|
| 6,695,903 B1 | 2/2004 | Kubelbeck et al. |
| 6,737,340 B2 | 5/2004 | Meier et al. |
| 6,982,864 B1 | 1/2006 | Sridharan et al. |
| 7,176,152 B2 | 2/2007 | Brown et al. |
| 2004/0003836 A1 | 1/2004 | Watsuji et al. |
| 2006/0028788 A1 | 2/2006 | Sridharan et al. |
| 2006/0102228 A1 | 5/2006 | Sridharan et al. |
| 2006/0162766 A1* | 7/2006 | Gee et al. ................ 136/256 |
| 2006/0289055 A1 | 12/2006 | Sridharan et al. |
| 2007/0079868 A1 | 4/2007 | Rose et al. |
| 2007/0095387 A1 | 5/2007 | Fujii et al. |
| 2007/0108423 A1 | 5/2007 | Brown et al. |
| 2007/0215202 A1 | 9/2007 | Salami et al. |
| 2009/0283141 A1* | 11/2009 | Bentzen et al. ........... 136/256 |

* cited by examiner

US 8,309,844 B2

THICK FILM PASTES FOR FIRE THROUGH APPLICATIONS IN SOLAR CELLS

FIELD OF THE INVENTION

This invention relates to aluminum conductor formulations made from an aluminum source, a source of at least one other metal, and glass frit dispersed in an organic system. The formulations can fire-through a passivation layer, thereby allowing the use of a passivation layer on the back side of a silicon wafer based photovoltaic cell. The formulations are screen-printable and suitable for use in the fabrication of photovoltaic devices, in particular a back side contact of a solar cell.

BACKGROUND

Solar cells are generally made of semiconductor materials, such as silicon (Si), which convert sunlight into useful electrical energy. A solar cell contact is in generally made of thin wafers of Si in which the required PN junction is formed by diffusing phosphorus (P) from a suitable phosphorus source into a P-type Si wafer. The side of the silicon wafer on which sunlight is incident is generally coated with an anti-reflective coating (ARC) to prevent reflective loss of sunlight. This ARC increases the solar cell efficiency. A two dimensional electrode grid pattern known as a front contact makes a connection to the N-side of silicon, and a coating of predominantly aluminum (Al) makes connection to the P-side of the silicon (back contact). Further, contacts known as silver rear contacts, made out of silver or silver-aluminum paste are printed and fired on the P-side of silicon to enable soldering of tabs that electrically connect one cell to the next in a solar cell module. These contacts are the electrical outlets from the PN junction to the outside load.

The back side of the silicon wafer typically includes Al paste, but generally lacks an ARC. Conventional back-side Al pastes do not fire through typical ARC materials such as $SiN_x$, $SiO_2$, and $TiO_2$. Conversely, pastes that fire through well on the front side of silicon do not form a Back Surface Field (BSF) layer, and are hence unsuitable for use in solar cell back contacts.

Hence, there is room in the art for a back-side paste that can both (1) fire through a passivation layer ($SiN_x$ or $SiO_2$ or $TiO_2$) and (2) simultaneously achieve good BSF formation on the back side of silicon.

Presently, a typical solar cell silicon wafer is about 200-300 microns thick, and the trend is toward thinner wafers. Because the wafer cost is about 60% of the cell fabrication cost, the industry is seeking ever-thinner wafers, approaching 150 microns. As the wafer thickness decreases, the tendency toward bowing (bending) of the cell due to the sintering stress increases, which is generated by the great difference in the thermal coefficients of expansion (TCE) between aluminum ($232 \times 10^{-7}/°$ C.@20–300° C.) and silicon, ($26 \times 10^{-7}/°$ C.@20–300° C.).

Known methods of mitigating silicon wafer bowing include reduction of aluminum content during screen-printing that causes incomplete formation of BSF layers and requires a higher firing temperature to achieve the same results. Chemical (acid) etching has been used to remove the Al—Si alloy that forms after firing the Aluminum paste. This is just another step in the manufacturing process that leads to additional cost.

Another approach is to use additives to reduce the thermal expansion mismatch between the Al layer and the silicon wafer. However, a drawback is a reduction in back surface passivation quality and a concomitant reduction in solar cell performance. Partial covers, where only a portion of the back side of the wafer is coated with aluminum, have been used to form a BSF to counteract bowing, which causes a reduction in cell performance.

Finally, another conventional way to reduce or eliminate bowing is cooling a finished solar cell from room temperature to ca. −50° C. for several seconds after firing. With such plastic deformation of the Al—Si paste matrix, bowing is largely eliminated, but this represents an additional process step, and there is a high danger of breakage from thermal stress.

Hence a need exists in the photovoltaic industry for a low-bow, high-performance aluminum paste that forms a sufficient BSF layer in a solar cell contact, a method of making such a contact, and an Al paste that will also fire through a passivation layer.

SUMMARY OF THE INVENTION

The invention provides a photovoltaic cell comprising a silicon wafer bearing a back contact, the back contact comprising a passivation layer at least partially coated with a fired back side paste comprising aluminum and a glass component.

A further embodiment of the invention is a photovoltaic cell comprising:
 (a) a front contact comprising a passivating layer onto which is applied a silver paste comprising, prior to firing, silver, a glass component, and a vehicle, and
 (b) a back contact comprising a passivating layer onto which is applied an aluminum paste comprising, prior to firing, aluminum a glass component, and a vehicle.

Yet another embodiment of the invention includes a method of making a photovoltaic cell comprising:
 (a) providing a silicon wafer having a first side and a second side,
 (b) applying a phosphorus source to the first side of the silicon wafer,
 (c) firing the wafer to form a phosphorus glass layer on the first side of the silicon wafer,
 (d) removing at least a portion of the phosphorus glass layer from the first side of the silicon wafer,
 (e) polishing the second side of the silicon wafer,
 (f) applying a passivating layer to the first and second sides of the wafer,
 (g) applying to the first side a silver paste comprising, prior to firing, silver, a glass component, and a vehicle,
 (h) applying to the second side an aluminum paste comprising, prior to firing, aluminum, a glass component, and a vehicle,
 wherein (g) and (h) can be performed in any order, and
 (i) firing the wafer for a time and temperature sufficient to adhere the silver to the front side and the aluminum to the back side, thereby forming front and back contacts.

An embodiment of the invention provides a thick film paste composition comprising about 40 to about 80 wt % aluminum and about 0.1 to about 50 wt % silver.

Finally, an embodiment of the invention is a solar cell including a back contact,
 wherein the back contact comprises, prior to firing, a thick film paste composition comprising about 40 to about 80 wt % aluminum and about 0.1 to about 50 wt % silver.

The pastes herein can be used to form conductors in applications other than solar cells, and employing other substrates, such as, for example, glass, ceramics, enamels, alumina, and metal core substrates. For example, an embodiment of the invention is a device including an electronic circuit comprising aluminum, a glass component, and at least one other metal selected from the group consisting of palladium, silver, platinum, gold, boron, gallium, indium, zinc, tin, antimony, magnesium, potassium, titanium, vanadium, nickel, copper, and combinations thereof, wherein the device is selected from the group consisting of MCS heaters, LED lighting, thick film hybrids, fuel cell systems, and automotive electronics.

The compositions and methods of the present invention overcome the drawbacks of the prior art by optimizing interaction, bonding, and contact formation between back contact components, typically silicon with aluminum, as well as allowing the use of a back contact passivation layer, which further improves solar cell efficiency.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

Figure 1A:
FIGS. 1A-1E provide a process flow diagram schematically illustrating the fabrication of a semiconductor device. Reference numerals shown in FIGS. 1A-1E are explained below.

10: p-type silicon substrate
 20: n-type diffusion layer
 30: front side passivation layer/anti-reflective coating (e.g., $SiN_x$, $TiO_2$, $SiO_2$ film)
 35: back side passivation layer (e.g., $SiN_x$, $TiO_2$, $SiO_2$ film)
 40: p+ layer (back surface field, BSF)
 60: aluminum-(16-metals) paste formed on backside
 61: aluminum-(16-metals) back electrode after firing showing fire through of passivation layer and BSF formation
 70: silver or silver/aluminum paste formed on backside
 71: silver or silver/aluminum back electrode (obtained by firing back side silver paste)
 80: gap in silver aluminum back paste or electrode
 500: silver paste formed on front side
 501: silver front electrode after firing through ARC

DETAILED DESCRIPTION OF THE INVENTION

The invention is generally directed to conductive paste formulations including aluminum and glass or aluminum, glass, and at least one other metal, which are useful in a variety of applications including silicon semiconductor devices such as photovoltaic (PV) cells, commonly known as solar cells. In particular it pertains to an electro-conductive composition used in formation of a thick film electrode of a solar cell, i.e., a paste. The invention is further directed to an Al electro-conductive thick film composition to achieve fire-through of the backside ARC in silicon solar cells. The ARC can include any or all of $SiN_x$, $SiO_2$, or $TiO_2$, and also serves as the passivation layer. The terms "ARC" and "passivation layer" will be used interchangeably herein. The formulations are generally screen printable and suitable for use in photovoltaic devices, however, other application procedures may be used such as spraying, hot melt printing, pad printing, ink-jet printing, and tape lamination techniques with suitable modifications of the organics. The invention will enable solar cell manufacturers to use novel solar cell designs, to give higher efficiencies and also allow use of thinner wafers that can lead to substantial cost savings in large-scale manufacturing. The invention also allows use of much less backside Al paste in certain cell designs compared to conventional solar cells, leading to further cost savings.

The conductive thick film compositions herein permit good fire-through of the backside passivation layer by the Al paste and effective formation of a BSF layer of 2-10 microns at the silicon-aluminum interface. It is believed that the use of a passivation layer such as $SiN_x$ on the backside of the silicon wafer means that lack of passivation is no longer a limiting factor in solar cell efficiency on thin, large area wafers. Alternatively, the pastes of the present invention can also be used in certain non-fire through applications that require a controlled BSF region. It is believed that the use of aluminum in a back contact helps reduce silver migration.

The pastes herein are also useful in situations where a passivation layer applied to the front side of a silicon wafer contaminates the back side (i.e., back side passivation is not intended), in order to fire through such contaminated backside passivation layer.

In order to produce an effective BSF layer at the silicon-aluminum interface, the invention provides a conductive thick film paste, which prior to firing, includes aluminum particles, particles of another metal such as silver, copper, nickel, and others as silicon dopants, glass particles, and an organic vehicle. The paste is generally applied to the back surface of a p-type silicon substrate previously coated with a passivation layer, such as $SiN_x$ or $SiO_2$ or $TiO_2$.

The invention provides a photovoltaic cell comprising a silicon wafer bearing a back contact, the back contact comprising a passivation layer at least partially coated with a fired back side paste comprising aluminum and a glass component.

A further embodiment of the invention is a photovoltaic cell comprising:
 (c) a front contact comprising a passivating layer onto which is applied a silver paste comprising, prior to firing, silver, a glass component, and a vehicle, and
 (d) a back contact comprising a passivating layer onto which is applied an aluminum paste comprising, prior to firing, aluminum a glass component, and a vehicle.

Yet another embodiment of the invention includes a method of making a photovoltaic cell comprising:
 (j) providing a silicon wafer having a first side and a second side,
 (k) applying a phosphorus source to the first side of the silicon wafer,
 (l) firing the wafer to form a phosphorus glass layer on the first side of the silicon wafer,
 (m) removing at least a portion of the phosphorus glass layer from the first side of the silicon wafer,
 (n) polishing the second side of the silicon wafer,
 (o) applying a passivating layer to the first and second sides of the wafer,
 (p) applying to the first side a silver paste comprising, prior to firing, silver, a glass component, and a vehicle,
 (q) applying to the second side an aluminum paste comprising, prior to firing, aluminum, a glass component, and a vehicle,
 wherein (g) and (h) can be performed in any order, and
 (r) firing the wafer for a time and temperature sufficient to adhere the silver to the front side and the aluminum to the back side, thereby forming front and back contacts.

An embodiment of the invention provides a thick film paste composition comprising about 40 to about 80 wt % aluminum and about 0.1 to about 50 wt % silver.

Another embodiment of the invention is a solar cell including a back contact, wherein the back contact comprises, prior to firing, a thick film paste composition comprising about 40 to about 80 wt % aluminum and about 0.1 to about 50 wt % silver. Other metals selected from the group consisting of palladium, platinum, gold, boron, gallium, indium, zinc, tin, antimony, magnesium, titanium, potassium, vanadium, nickel, and copper, and combinations thereof may also be included with aluminum in place of or in addition to silver.

The pastes herein can be used to form conductors in applications other than solar cells, and employing other substrates, such as, for example, glass, ceramics, enamels, alumina, and metal core substrates. For example, an embodiment of the invention is a device including an electronic circuit comprising aluminum, a glass component, and at least one other metal selected from the group consisting of palladium, silver, platinum, gold, boron, gallium, indium, zinc, tin, antimony, magnesium, potassium, titanium, vanadium, nickel, copper, and combinations thereof, wherein the device is selected from the group consisting of MCS heaters, LED lighting, thick film hybrids, fuel cell systems, and automotive electronics.

Still another embodiment of the provides a thick film paste composition comprising about 40 to about 80 wt % aluminum and about 0.5 wt % to about 10 wt % glass that can fire through the passivation layer.

Finally, an embodiment of the invention is a solar cell array or panel comprising any solar cell disclosed herein comprising any backside aluminum paste disclosed herein.

Preferred embodiments of the invention include groupings of metals as follows: palladium, silver, platinum, gold, and combinations thereof (highly conductive or electrical conduction modifier); boron, gallium, indium, and combinations thereof (trivalent dopants for P type silicon); zinc, tin, antimony, and combinations thereof (low melting metals); and magnesium, titanium, potassium, vanadium, nickel, copper, and combinations thereof (grain modifiers/refiners).

Broadly, thick film pastes containing aluminum and glass frit are used to make back contacts for silicon-based solar cells to conduct to an external load the current generated by exposure to light. Solar cells with screen printed aluminum back contacts are fired to relatively low temperatures (550° C. to 850° C. wafer temperature; furnace set temperatures of 650° C. to 1000° C.) to form a low resistance contact between the P-side of a boron doped silicon wafer and an aluminum based paste. Methods for making solar cells are also envisioned herein.

Pastes containing aluminum and glass are used to form low resistance ohmic contacts on the back side of a solar cell due to large area melting and re-solidification of the Al-doped ($p^+$) epitaxially grown Si layer which increases the solar cell performance due to an improved BSF. For optimum performance, a thick $p^+$ re-grown region is believed to be ideal. During firing, a $p^+$ layer forms on the underlying silicon by liquid-phase epitaxial growth of silicon from the aluminum-silicon (Al—Si) melt. It is also believed that the rejection of metallic impurities from the epitaxially growing $p^+$ layer leads to high carrier lifetimes. These two factors are believed to increase the open circuit voltage, and more importantly, the open circuit voltage falls only slightly as the bulk resistivity increases. Therefore solar cell performance improves due to the formation of a substantial epitaxially re-grown $p^+$ layer in the Al back contact.

Lead glasses are used in general in the pastes due to their superior low melting characteristics coupled with their good wetting characteristics. For environmental reasons it is desirable to use lead free and cadmium free glasses, or glasses that are at least substantially free of lead and cadmium. High-bismuth lead-free and cadmium-free glasses allow low firing temperatures in making front contacts owing to their excellent flow characteristics at relatively low temperatures. Alkali-titanium-silicate glasses are another route to attain lower firing temperatures.

The pastes can be prepared either by mixing individual components (i.e. metals, glass frits, and organic vehicles) or by blending pastes that are Al based (major component) with silver or other metal(s) or alloys of metals (minor component) that achieve the desired objectives. Broadly construed, the inventive pastes comprise a conductive metal including at least aluminum, glass, and a vehicle. Each ingredient is detailed hereinbelow.

Metal Component. The major metal component of the fire-through paste is aluminum. Aluminum is used because it forms a p+/p surface and provides a BSF for enhancing solar cell performance. The backside fire-through pastes of the invention include about 40 to about 80 wt % aluminum, preferably about 60 to about 80 wt % aluminum and more preferably about 65 to about 75 wt % aluminum. However, Al by itself cannot fire through the passivation layer and requires other metals to penetrate the non-conducting passivation layer.

Other metals or alloys, from about 0.5% to about 50 wt % of the paste, aid in achieving aluminum fire-through of the passivation layer. In localized application, where the metal paste covers, say less than about 10% of the total back contact surface area, bowing is not critical and spherical powder morphology could be used for silver and aluminum. However, when the entire back contact is fully covered with Al paste, a morphology that minimizes shrinkage, such as flakes, is preferred. The Al particles are generally about 2 to about 20 microns, preferably, about 3 to about 10 microns. The other metal particles are about 2 to about 20 microns, more preferably about 2 to about 8 microns. It is preferred to have Al and other metals/alloys of 99+% purity to optimize solar cell electrical performance.

Physical and chemical forms of the metals. All metals herein may be provided in one or more of several physical and chemical forms. Broadly, metal powders, flakes, salts, oxides, glasses, colloids, and organometallics are suitable. Generally, the metal powder sizes are about 0.1 to about 40 microns, preferably up to about 10 microns. More preferably, the metal particle sizes are in line with the sizes of aluminum and silver particles herein, in a back contact. Further, generally, the 16 metals may be provided in the form of ionic salts, such as the halides, carbonates, hydroxides, phosphates, nitrates, sulfates, and sulfites, of the metal of interest. Organometallic compounds of any of the metals may also be used, including, without limitation, the acetates, formates, carboxylates, phthalates, isophthalates, terephthalates, fumarates, salicylates, tartrates, gluconates, or chelates such as those with ethylenediamine (en) or ethylenediamine tetraacetic acid (EDTA). Other appropriate powders, salts, oxides, glasses, colloids, and organometallics containing at least one of the 16 metals will be readily apparent to those skilled in the art. Generally, aluminum and the 16 metals are provided as metal powders or flakes.

For example the paste may comprise about 80 to about 99 wt % spherical metal particles or alternatively about 35 to about 70 wt % metal particles and about 29 to about 55 wt % metal flakes. Alternatively the paste may comprise about 75 to about 90 wt % metal flakes and about 5 to about 9 wt % of colloidal metal, or about 60 to about 95 wt % of metal powder or flakes and about 4 to about 20 wt % of colloidal metal.

The foregoing combinations of particles, flakes, and colloidal forms of the foregoing metals are not intended to be limiting, where one skilled in the art would know that other combinations are possible. Suitable commercial examples of aluminum particles are available from Alcoa, Inc., Pittsburgh, Pa.; Ampal Inc., Flemington, N.J.; and ECKA Granulate GmbH & Co. KG, of Füirth, Germany.

The content of the conductive metal(s) other than aluminum is not particularly limited as long as it is an amount that can achieve the objective of the present invention. Preferably, however, the paste compositions herein comprise about 0.1 to about 50 wt %, of metals or alloys other than aluminum to obtain the desired properties, such as silver, copper, nickel or magnesium. In particular, certain embodiments comprise about 0.1 to about 50 wt %, 1 to about 25 wt %, more preferably about 2 to about 10 wt % of silver. Further embodiments comprise about 3 to about 50 wt %, preferably about 3 to about 15 wt %, more preferably about 3 to about 10 wt % copper. A further embodiment comprises about 1 to about 50 wt %, preferably about 5 to about 25 wt %, and more preferably about 5 to about 15 wt % nickel. In another embodiment, the paste includes about 1 to about 50 wt %, preferably about 3 to about 25 wt %, more preferably about 5 to about 15 wt % magnesium. The paste may also comprise about 1 to about 50 wt %, preferably about 5 to about 25 wt % boron. Contacts and solar cells including the above metals are envisioned herein.

Silver doping of silicon is one preferred route in the invention, however other conductive metals from groups such as (a) palladium, silver, platinum, gold, and combinations thereof (highly conductive or electrical conduction modifier); (b) boron, gallium, indium, and combinations thereof (trivalent dopants for P type silicon); (c) zinc, tin, antimony, and combinations thereof (low melting metals); and (d) magnesium, titanium, potassium, vanadium, nickel, copper, and combinations thereof (grain modifiers/refiners). Further alloys such as Al—Cu, Al—Mg, Al—Si, Al—Zn, and Al—Ag, and Ag—Pd, Pt—Au, Ag—Pt, may also be used for silicon doping. Mixtures of the 16 metals can also be used for the pastes, contacts, and solar cells herein.

Paste Glasses. The pastes comprise about 0.5 to about 10 wt %, preferably about 0.5 to about 8 wt %, more preferably about 0.5 to about 5 wt %, and still more preferably about 0.5 to about 2.5 wt % of a powdered glass component. The glass component comprises, prior to firing, one or more glass compositions. Each glass composition comprises oxide frits including, in one embodiment, $Bi_2O_3$, alkali oxides, $B_2O_3$ and $SiO_2$. In another embodiment, the glass composition comprises an alkali oxide, $TiO_2$, and $SiO_2$. In yet another embodiment, the glass composition comprises PbO. In particular, in various embodiments of the present invention, glass compositions for back contacts may be found in Tables 1-3. The entry "20 trivalent oxides" means one or more trivalent oxides of an element selected from the group consisting of Al, Ga, In, Sc, Y, and an element having an atomic number of from 57 to 71. In formulating the pastes, the glass frits typically have particle sizes of about 0.2 to about 10 microns, although other particle sizes may be used as known in the art. It is preferable that the glass powder used in the paste formulation have Tg in the range of 300° C. to 700° C., preferably in the 400 to 550° C. range.

Looking to Tables 1-3, more than one glass composition can be used, and compositions comprising amounts from different columns in the same table are also envisioned. If a second glass composition is used, the proportions of the glass compositions can be varied to control the extent of paste interaction with silicon and hence the resultant solar cell properties, and to control the bowing of the silicon wafer. For example, within the glass component, the first and second glass compositions may be present in a weight ratio of about 1:20 to about 20:1, and preferably about 1:5 to about 5:1. The glass component preferably contains no lead or oxides of lead, and no cadmium or oxides of cadmium. However, in certain applications where the properties of PbO cannot be duplicated, such embodiments advantageously comprise PbO. An entry such as "$Li_2O+Na_2O+K_2O$" means that the total content of $Li_2O$ and $Na_2O$ and $K_2O$ and $Rb_2O$ falls within the specified ranges. In each range having a lower bound of zero, a preferred embodiment thereof is the same range having a lower bound of 0.1%.

TABLE 1

Oxide frit ingredients for bismuth-based back contact glasses in mole percent.

| | Glass Composition | | |
|---|---|---|---|
| Ingredient | I | II | III |
| $Bi_2O_3$ | 5-85 | 10-75 | 12-50 |
| $B_2O_3 + SiO_2$ | 5-75 | 15-75 | 34-71 |
| ZnO | 0-55 | 0-20 | 0-12 |
| $Li_2O + Na_2O + K_2O$ | 0-40 | 5-30 | 10-30 |
| 20 trivalent oxides | 0-25 | 0-20 | 3-10 |
| $Sb_2O_5 + Nb_2O_5$ | 0-40 | 0-30 | 0-20 |
| $TiO_2 + ZrO_2$ | 0-20 | 0-10 | 1-6 |

TABLE 2

Oxide frit ingredients for alkali-titanium-silicate back contact glasses in mole percent.

| | Glass Composition | | |
|---|---|---|---|
| Ingredient | IV | V | VI |
| $Li_2O + Na_2O + K_2O$ | 5-55 | 15-50 | 30-40 |
| $TiO_2$ | 2-26 | 10-26 | 15-22 |
| $B_2O_3 + SiO_2$ | 5-75 | 25-70 | 30-52 |
| $V_2O_5 + Sb_2O_5 + P_2O_5$ | 0-30 | 0.25-25 | 5-25 |
| MgO + CaO + BaO + SrO | 0-20 | 0-15 | 0-10 |
| F | 0-20 | 0-15 | 5-13 |

TABLE 3

Oxide frit ingredients for lead based back contact glasses in mole percent.

| | Glass Composition | | |
|---|---|---|---|
| Ingredient | VII | VIII | IX |
| PbO | 15-75 | 25-66 | 50-65 |
| $B_2O_3 + SiO_2$ | 5-75 | 20-60 | 24-55 |
| ZnO | 0-55 | 0.1-35 | 0.1-25 |
| $Li_2O + Na_2O + K_2O$ | 0-40 | 0-30 | 0-10 |
| $TiO_2 + ZrO_2$ | 0-20 | 0-10 | 0.1-5 |
| 20 trivalent oxides | 0-25 | 0.1-20 | 1-10 |

In a preferred embodiment the glass component comprises: about 12 to about 50 mole % $Bi_2O_3$; about 25 to about 65 mole % $SiO_2$; about 5 to about 15 mole % $B_2O_3$; about 4 to about 26 mole % $K_2O$; $TiO_2$, wherein the content of $TiO_2$ does not exceed about 10 mole %; and an oxide of an element selected from the group Li, Na, K, Rb and combinations thereof, provided the combined total of such oxides does not exceed about 40 mol %, preferably at least about 1 mol % of the combination. In a preferred embodiment containing alkali oxides the glass component comprises about 1 to about 15 mole % $Li_2O$, about 8 to about 25 mole % $Na_2O$, about 3 to about 25 mole % $K_2O$, about 8 to about 22 mole % $TiO_2$, about 25 to about 50 mole % $SiO_2$, about 2 to about 18 mole % $V_2O_5$, and about 0.25 to about 5 mole % $P_2O_5$, and may further comprise fluoride, not to exceed about 20 mol %.

In another preferred embodiment, the composition may comprise one or more of the following, so long as the content of the following oxides does not exceed the indicated amount in mol % $Li_2O$ (15%), $Na_2O$ (25%), $K_2O$ (25%), $Rb_2O$ (25%), $TiO_2$ (22%), $SiO_2$ (60%), $V_2O_5$ (18%), the sum of ($Sb_2O_5+V_2O_5+P_2O_5$) (25%), and F (15%)

The most preferred embodiments are those using lead free and cadmium free glasses discussed above. However, when properties unattainable by other than leaded glasses are required, then the glass component may comprise one or more of the following, so long as the content of the following oxides does not exceed the indicated amount in mol % PbO (75%), $SiO_2$ (55%), $B_2O_3$ (55%), ZnO (25%), and trivalent oxides of elements selected from the group consisting of Al, Ga, In, Sc, Y, La (25%), and ($TiO_2+ZrO_2$) (5%), provided that the total of ($B_2O_3+SiO_2$) does not exceed 45%. The lead-containing glass components may further comprise about 0.1 to about 10 mol % $Al_2O_3$.

Vehicle. The pastes herein include a vehicle or carrier which is typically a solution of a resin dissolved in a solvent and, frequently, a solvent solution containing both resin and a thixotropic agent. The organics portion of the pastes comprises (a) at least about 80 wt % organic solvent; (b) up to about 15 wt % of a thermoplastic resin; (c) up to about 4 wt % of a thixotropic agent; and (d) up to about 2 wt % of a wetting agent. The use of more than one solvent, resin, thixotrope, and/or wetting agent is also envisioned.

Ethyl cellulose is a commonly used resin. However, resins such as ethyl hydroxyethyl cellulose, wood rosin, mixtures of ethyl cellulose and phenolic resins, polymethacrylates of lower alcohols and the monobutyl ether of ethylene glycol monoacetate can also be used. Solvents having boiling points (1 atm) from about 130° C. to about 350° C. are suitable. Widely used solvents include terpenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), hexylene glycol, Texanol® (2,2,4-trimethyl-1,3-pentanediol monoisobutyrate), as well as other alcohol esters, kerosene, and dibutyl phthalate. The vehicle can contain organometallic compounds, for example those based on aluminum or boron, to modify the contact. N-Diffusol® is a stabilized liquid preparation containing an n-type diffusant with a diffusion coefficient similar to that of elemental phosphorus. Various combinations of these and other solvents can be formulated to obtain the desired viscosity and volatility requirements for each application. Other dispersants, surfactants and rheology modifiers, which are commonly used in thick film paste formulations, may be included. Commercial examples of such products include those sold under any of the following trademarks: Texanol® (Eastman Chemical Company, Kingsport, Tenn.); Dowanol® and Carbitol® (Dow Chemical Co., Midland, Mich.); Triton® (Union Carbide Division of Dow Chemical Co., Midland, Mich.), Thixatrol® (Elementis Company, Hightstown N.J.), and Diffusol®(t (Transene Co. Inc., Danvers, Mass.).

Among commonly used organic thixotropic agents is hydrogenated castor oil and derivatives thereof. A thixotrope is not always necessary because the solvent coupled with the shear thinning inherent in any suspension may alone be suitable in this regard. Furthermore, wetting agents may be employed such as fatty acid esters, e.g., N-tallow-1,3-diaminopropane di-oleate; N-tallow trimethylene diamine diacetate; N-coco trimethylene diamine, beta diamines; N-oleyl trimethylene diamine; N-tallow trimethylene diamine; N-tallow trimethylene diamine dioleate, and combinations thereof.

Other Additives. Other inorganic additives may be added to the paste to the extent of about 1 to about 30 wt %, preferably about 2 to about 25 wt % and more preferably about 5 to about 20 wt % based on the weight of the paste prior to firing. Other additives such as clays, fine silicon, silica, or carbon, or combinations thereof can be added to control the reactivity of the aluminum with silicon. Common clays which have been calcined are suitable. Fine particles of low melting metal additives (i.e., elemental metallic additives as distinct from metal oxides) such as Pb, Bi, In, Zn, and Sb, and alloys of each can be added to provide a contact at a lower firing temperature, or to widen the firing window.

A mixture of (a) glasses or (b) crystalline additives and glasses or (c) one or more crystalline additives can be used to formulate a glass component in the desired compositional range. The goal is to reduce bowing and improve the solar cell electrical performance. For example, second-phase crystalline ceramic materials such as $SiO_2$, ZnO, MgO, $ZrO_2$, $TiO_2$, $Al_2O_3$, PbO, $Bi_2O_3$, $V_2O_5$, $MoO_3$, $WO_3$, $Sb_2O_3$SnO and $In_2O_3$ and reaction products thereof and combinations thereof may be added to the glass component to adjust contact properties. However, the total amounts of the above oxides must fall within the ranges specified for various embodiments disclosed herein. Ceramic additives include particles such as hectorite, talc, kaolin, attapulgite, bentonite, smectite, quartz, mica, feldspar, albite, orthoclase, anorthite, silica, and combinations thereof. Both crystalline and amorphous silica are suitable.

Paste Preparation. The paste according to the present invention may be prepared on a planetary mixer. The amount and type of organic vehicles utilized are determined mainly by the final desired formulation viscosity, fineness of grind of the paste, and the desired wet print thickness. Generally, the wet paste comprises about 15 to about 40 wt %, preferably about 20 to about 35 wt % of an organic vehicle. The organic vehicle may include, for example, alkyl ester alcohols, terpineols, and dialkyl glycol ether, as in Table 4, below, and/or other organics as disclosed herein.

In preparing the backside thick film paste compositions of the invention, the particulate inorganic solids are mixed with a vehicle and dispersed with suitable equipment, such as a planetary mixer, to form a suspension, resulting in a composition for which the viscosity will be in the range of about 200 to about 4000 poise, preferably about 500-1500 poise, more preferably 800-1200 poise at a shear rate of 9.6 $sec^{-1}$ as determined on a Brookfield viscometer HBT, spindle 14, measured at 25° C. Generally, when the back contact is only partially covered with the paste, the viscosity should be higher. General compositional ranges for pastes according to the invention are presented in Table 4.

TABLE 4

Broad Paste Formulations for Al fire through Conductor

| Ingredients-wt % | 1 | 2 | 3 | 4 | 5 | 6 | 7 |
|---|---|---|---|---|---|---|---|
| Aluminum | 40-80 | 60-80 | 65-75 | 40-80 | 40-80 | 40-80 | 40-80 |
| Silver | 0.5-50 | 1-25 | 2-10 | | | | |
| Nickel | | | | | 3-50 | | |

TABLE 4-continued

Broad Paste Formulations for Al fire through Conductor

| Ingredients-wt % | 1 | 2 | 3 | 4 | 5 | 6 | 7 |
|---|---|---|---|---|---|---|---|
| Copper | | | | | | 3-50 | |
| AlMg alloy | | | | | | | 1-50 |
| Alkyl ester alcohol | 10-20 | 10-20 | 10-20 | 10-20 | 10-20 | 10-20 | 10-20 |
| Terpeneols | 5-15 | 5-15 | 5-15 | 5-15 | 5-15 | 5-15 | 5-15 |
| Dialkyl glycol ether | 0-5 | 0-5 | 0-5 | 0-5 | 0-5 | 0-5 | 0-5 |
| Glass content | 0.5-10 | 0.5-10 | 0.5-10 | 0.5-10 | 0.5-10 | 0.5-10 | 0.5-10 |
| Metal ethoxide | 0-10 | 0-10 | 0-10 | 0-10 | 0-10 | 0-10 | 0-10 |
| Ethanol | 0-0.5 | 0-0.5 | 0-0.5 | 0-0.5 | 0-0.5 | 0-0.5 | 0-0.5 |
| Silica | 0-0.5 | 0-0.5 | 0-0.5 | 0-0.5 | 0-0.5 | 0-0.5 | 0-0.5 |

Printing and Firing of the Pastes. The inventive method of making a solar cell back contact comprises: (1) applying a Ag or Ag/Al back contact paste, (2) drying the paste, (3) applying an Al-containing paste to the P-side of a silicon wafer on which a passivation layer is already applied, (4) drying the paste, (5) applying the front contact silver paste, (6) drying the paste, and (7) co-firing the pastes to make contact to silicon.

The Al-paste may contain any or all of the 16 metals, or possibly none of them, so long as certain glasses are present. In particular, Al is useful alone so long as the glass contains lead. The solar cell printed with silver rear contact Ag-paste, Al-back contact paste, and Ag-front contact paste is fired at a suitable furnace temperature, such as about 650-1000° C. furnace set temperature; or about 550-850° C. wafer temperature. During firing, the ARC is attacked and corroded by the combination of glass and Al/Ag paste; i.e. "fire-through." Also during firing as the wafer temperature rises above the Al—Si eutectic temperature of 577° C., the back contact Al and (16 metals) dissolve Si from the substrate and to form a liquid layer of Al—Si and (16 metals).

Also during firing as the wafer temperature rises above the various eutectic temperatures of Al with each of the other metals, the back contact Al and (16 metals) dissolves Si from the substrate and a liquid Al-(16 metals)-Si layer is formed. This Al-(16 metals)-Si liquid continues to dissolve substrate Si during further heating to peak temperature. During the cool down period, Si precipitates back from the Al-(16 metals)-Si melt. This precipitating Si grows as an epitaxial layer on the underlying Si substrate and forms a p+ layer. When the cooling melt reaches the lowest eutectic temperature of Al—Si-metal melt, the remaining liquid freezes as an Al—Si-metal eutectic layer. A p+ layer is believed to provide a BSF, which in turn increases the solar cell performance. The glass in the Al-(16 metals) back contact should optimally interact with both Al and Si without unduly affecting the formation of an efficient BSF layer.

Method of Front and Back Contact Production. Referring now to FIGS. 1A-1E, a solar cell front contact according to the present invention generally can be produced by applying any silver-based paste to a solar grade Si wafer. In particular, FIG. 1A schematically shows a step in which a substrate of single-crystal silicon or multicrystalline silicon is provided, typically with a textured surface which reduces light reflection. In the case of solar cells, substrates are often used as sliced from ingots which have been formed from pulling or casting processes. Substrate surface damage caused by tools such as a wire saw used for slicing and contamination from the wafer slicing step are typically removed by etching away about 10 to 20 microns of the substrate surface using an aqueous alkali solution such as KOH or NaOH, or using a mixture of HF and $HNO_3$. The substrate optionally may be washed with a mixture of HCl and $H_2O_2$ to remove heavy metals such as iron that may adhere to the substrate surface. An antireflective textured surface is sometimes formed thereafter using, for example, an aqueous alkali solution such as aqueous potassium hydroxide or aqueous sodium hydroxide. This gives the substrate, 10, depicted with exaggerated thickness dimensions, as a typical silicon wafer is ca. 200 microns thick.

Figure 1B:
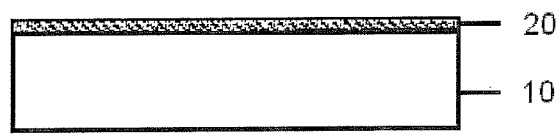

Referring to FIG. 1B, schematically showing that, when a p-type substrate is used, an n-type layer 20 is formed to create a p-n junction. A phosphorus diffusion layer is supplied in any of a variety of suitable forms, including phosphorus oxychloride ($POCl_3$), organophosphorus compounds, and others disclosed herein. The phosphorus source may be selectively applied to only one side of the silicon wafer. The depth of the diffusion layer can be varied by controlling the diffusion temperature and time, is generally about 0.3 to 0.5 microns, and has a sheet resistivity of about 40 to about 100 ohms per square. The phosphorus source may include phosphorus-containing liquid coating material such as phosphosilicate glass (PSG) is applied onto only one surface of the substrate by a process such as spin coating, where diffusion is effected by annealing under suitable conditions.

Figure 1C:
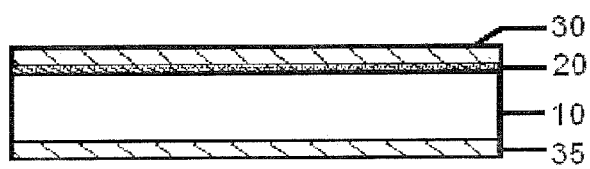

Next, in FIG. 1C, an antireflective coating (ARC) 30, which also usually serves as a passivating film, which may be $SiN_x$, $TiO_2$ or $SiO_2$, is formed on the above-described n-type diffusion layer, 20. A passivating film 35 is similarly applied to the back side of the silicon wafer 10. Silicon nitride is sometimes expressed as $SiN_x$:H to emphasize passivation by hydrogen. The ARC 30 reduces the surface reflectance of the solar cell to incident light, thus increasing the amount of light absorption, and thereby increasing the electrical current generated. The thickness of passivating layers 30 and 35 depends on the refractive index of the material applied, although a thickness of about 700 to 900 Å is suitable for a refractive index of about 1.9 to 2.0. The passivating layer may be formed by a variety of procedures including low-pressure CVD, plasma CVD, or thermal CVD. When thermal CVD is used to form a $SiN_x$ coating, the starting materials are often dichlorosilane ($SiC_{12}H_2$) and ammonia ($NH_3$) gas, and film formation is carried out at a temperature of at least 700° C. When thermal CVD is used, pyrolysis of the starting gases at the high temperature results in the presence of substantially no hydrogen in the silicon nitride film, giving a substantially stoichiometric compositional ratio between the silicon and the nitrogen—$Si_3N_4$. Other methods of forming a passivating layer are known in the art.

Figure 1D:
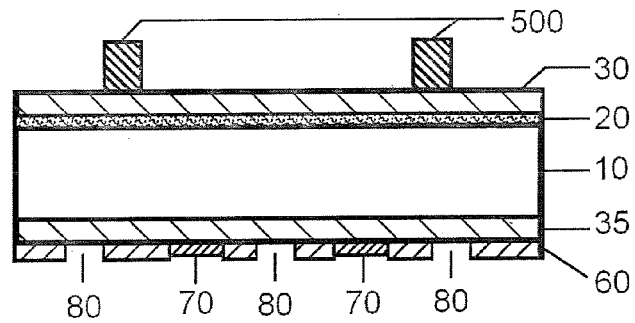

As shown in FIG. 1D, a back side silver or aluminum paste 70 and an Al-(16 metals) paste 60 are then selectively screen printed and successively dried on the backside of the substrate. While not individually labeled, it is noted that FIG. 1D shows six segments of paste 60 applied to the backside of the silicon wafer 10. Gaps 80 between segments of paste 60 leave backside passivation layer 35 uncovered. The Al-(16 metals) paste may include one or more glass frits from Tables 1, 2, or 3. A silver paste 500 for the front electrode is next screen printed and dried over the ARC 30. Firing is then carried out in an infrared belt furnace in a temperature range of approximately 700° C. to 1000° C. for a period of from about one to several minutes.

Figure 1E:
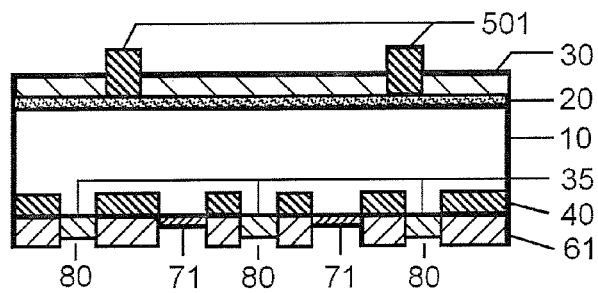

Consequently, as schematically shown in FIG. 1E, aluminum from the Al-(16 metals) paste melts and reacts with the silicon substrate 10 during firing, then solidifies forming a partial p+ layer, 40, containing a high concentration of aluminum dopant. This layer is generally called the back surface field (BSF) layer, and helps to improve the energy conversion efficiency of the solar cell. FIG. 1E shows six segments of layer 40, corresponding with the six segments of aluminum paste 60 applied in FIG. 1D. Passivation layer 35 remains essentially unchanged after firing (FIG. 1E) in those areas where it was not covered by aluminum paste 60 in FIG. 1D.

The Al-(16 metals) paste is transformed by firing from a dried state 60 to an aluminum back contact 61 including at least one of the 16 metals. The backside silver or aluminum paste 70 is fired at the same time, becoming a silver or aluminum back contact 71. During firing, the boundary between the back side Al-(16 metals) and the back side silver or aluminum assumes an alloy state, and is also connected electrically. The back contact is largely covered with the Al-(16 metals) paste, to a wet thickness of about 30 to 50 microns, owing in part to the need to form a thicker p+ layer 40. The back side silver paste areas are used for tab attachment during module fabrication. In addition, the front electrode-forming silver paste 500 sinters and penetrates through (i.e., fires through) the silicon nitride film 30 during firing, and is thereby able to electrically contact the n-type layer 20, as shown by front electrodes 501 in FIG. 1E.

A solar cell back contact according to the present invention can be produced by applying any Al paste disclosed herein, produced by mixing aluminum powders, with the glass compositions of Tables 1, 2, or 3, to the P-side of the silicon substrate pre-coated with silver rear contact paste, for example by screen printing, to a desired wet thickness, e.g., from about 30 to 50 microns. To make a front contact, front contact silver pastes are printed on the front side.

Common to the production of front contacts, back contacts and rear contacts is the following. Automatic screen-printing techniques can be employed using a 200-325 mesh screen. The printed pattern is then dried at 200° C. or less, preferably at about 120° C. for about 5-15 minutes before firing. The dry printed Al-(16 metals) back contact paste of the present invention can be co-fired with the silver rear contact and the front contact silver pastes for as little as 1 second up to about 5 minutes at peak temperature, in a belt conveyor furnace in air.

Nitrogen ($N_2$) or another inert atmosphere may be used if desired, but it is not necessary. The firing is generally according to a temperature profile that will allow burnout of the organic matter at about 300° C. to about 550° C., a period of peak furnace set temperature of about 650° C. to about 1000° C., lasting as little as about 1 second, although longer firing times as high as 1, 3, or 5 minutes are possible when firing at lower temperatures. For example a three-zone firing profile may be used, with a belt speed of about 1 to about 4 meters (40-160 inches) per minute. Naturally, firing arrangements having more than 3 zones are envisioned by the present invention, including 4, 5, 6, or 7, zones or more, each with zone lengths of about 5 to about 20 inches and firing temperatures of 650 to 1000° C.

EXAMPLES

Exemplary paste compositions formulated and tested are shown in Table 5. Table 6 shows performance of solar cells after printing and firing (using a three zone firing profile with 780-830-930° C. furnace set temperatures) the wafers with back Al fire-through pastes on the passivated back side of the wafers, in addition to printing standard rear contact and front side contact pastes. Polycrystalline silicon wafers, used in the following examples were 243 cm$^2$ in area, about 180 microns thick, and had a sheet resistivity of 60 ohms per square. The backside Al fire-through paste was printed on the back passivated side of the wafer, dried and fired in a three-zone furnace having set points of 780, 830, and 930° C. Electrical characterization using SunVoc measurements of the BSF and examination by SEM of transverse section was carried out. The details of paste preparation, printing, drying and firing are described in commonly owned U.S. Patent Application Publication Nos. US2006/0102228 and US 2006/0289055, the disclosures of which are incorporated by reference.

Exemplary aluminum based formulations in Table 5 were made with the commercially available glasses indicated plus commercially available 4-10 micron aluminum powders and commercially available 2-5 micron silver powders or flakes. Additional paste ingredients include Cabosil®, Min-U-Sil®, boron ethoxide and/or tetraethyl orthotitanate, Anti-Terra® 204, organic vehicles and Texanol®. The clay is $Na_{0.3}(Mg, Li)_3Si_4O_{10}(OH)_2$ which is calcined to drive off water, then pulverized (ball-milled) using conventional means, and wetted at a ratio of 40 wt % calcined clay, 59 wt % terpineol, and 1 wt % Anti-Terra® 204. Anti-Terra® is a wetting agent commercially available from BYK-Chemie GmbH, Wesel, Germany. Cabosil® is fumed silica, commercially available from Cabot Corporation, Billerica Mass. Min-U-Sil® is crystalline silica available from U.S. Silica Company, Berkeley Springs, West Va. Boron ethoxide and tetraethyl orthotitanate are available from Sigma-Aldrich, Dallas, Tex. Vehicles 131, 132, 205, 402, 450, and 473, as well as all noted glass compositions (starting with the letters EG, GL, IP) are commercially available from Ferro Corporation, Cleveland Ohio.

TABLE 5

Exemplary Paste Formulations for Al Fire-through Applications.

| Ingredient in wt % | Paste | | | | | |
|---|---|---|---|---|---|---|
| | I | II | III | IV | V | VI |
| Aluminum | 70.38 | 65.41 | 68.46 | 72.31 | 66.31 | 69.08 |
| Silver | 2.19 | 7.2 | | | 2.1 | |
| Copper | | | | | | 3.98 |
| Min-U-Sil | 0.39 | 0.36 | | 0.4 | | |
| Cabosil | | | 0.34 | | 0.33 | 0.38 |
| Hectorite | | | | | | 4.75 |
| Boron Ethoxide | | | 1.52 | | | |
| Tetraethyl Orthotitanate | | | 1.43 | | | |
| Glass Ferro EG 2050 | 0.58 | 0.54 | | 0.60 | | |
| Glass Ferro IP 510 | 0.97 | 0.90 | | 1.0 | | |
| Glass Ferro EG 9014 | 0.23 | | | 0.23 | | |
| Glass Ferro GL 4317 | | | | | 0.49 | |
| Glass Ferro EG 2761 | | 0.89 | | | | |
| Glass Ferro EG 2760 | | | 0.6 | | | |
| Glass Ferro EG 9063 | | | | | 0.15 | 0.22 |
| Glass Ferro EG 9322 | | | | | | 0.76 |
| Glass Ferro EG 9152 | | | | | | 0.76 |
| Glass Ferro EG 9294 | | | | 0.5 | | |
| Vehicle 205 | 6.11 | 5.67 | 9.45 | 6.27 | 9.22 | 5.8 |
| Vehicle 450 | 4.85 | 4.5 | 5.1 | 4.98 | 4.99 | 5.7 |
| Vehicle 131 | 0.37 | | | | | |
| Vehicle 132 | 0.2 | | | 0.2 | | |
| Vehicle 402 | | 1.69 | | | | |
| Vehicle 473 | | | | | 0.61 | 0.5 |
| Terpineol | 12.24 | 11.25 | 7.70 | 8.63 | 3.49 | 5.2 |
| Anti Terra | 0.96 | 0.89 | 1.12 | 0.98 | 1.1 | 0.95 |
| Texanol | 0.51 | 0.70 | 3.98 | 0.52 | 3.88 | 1.62 |
| Dowanol DB | 0.02 | | | 0.02 | 0.06 | 0.3 |
| Thixatrol | | | 0.30 | | 0.29 | |

The aluminum pastes in Table 5 were printed on a silicon solar cell that had been pre-coated with backside silver/aluminum paste CN33-451, available from Ferro Corporation, Cleveland, Ohio. The aluminum was Ampal ULT 3510 powder. About 1.7 grams of the respective pastes were printed onto the silicon wafers using a 200 mesh screen. After drying the back contact paste, the front contact paste CN33-455, available from Ferro Corporation, Cleveland, Ohio, was printed using a 280 mesh screen with 100 micron openings for finger lines and with about 2.8 mm spacing between the lines. The printed wafers were co-fired using a 3-zone infrared (IR) belt furnace with a belt speed of about 3 meters (120") per minute, with temperature settings of 780° C., 830° C., and 920° C., respectively. The zones were 7," 16," and 7" long, respectively.

TABLE 6

Properties of solar cells made with exemplary pastes from Table 5

| Paste | I | II | III |
|---|---|---|---|
| Sun Voc (V) | 0.589 | 0.585 | 0.552 |
| Bowing (mm) | 0.928 | 1.245 | 0.305 |
| Fired Surface Appearance | Very smooth | Very smooth | Very smooth |
| BSF Formed? | Yes | Yes | Yes |

Electrical performance of these solar cells was measured with a solar tester, Model 91193-1000, Oriel Instrument Co., Stratford, Conn., under AM 1.5 sun conditions, in accordance with ASTM G-173-03. The electrical properties of the resultant solar cells are set forth in Table 6, which shows typical solar cell electrical properties and bowing for similar wafers for comparison of a prior art low bow Al paste and pastes of the invention including Al—Ag back contact pastes of the invention. Jsc means current density; Isc means short circuit current; Voc means open circuit voltage measured at zero output current; Efficiency (Eff) and Fill Factor (FF) are known in the art. Wafer bowing is measured in millimeters. All four examples formed a good BSF.

Additional advantages and modifications will readily occur to those skilled in the art. Therefore, the invention in its broader aspects is not limited to the specific details and illustrative example shown and described herein. Accordingly, various modifications may be made without departing from the spirit or scope of the general invention concept as defined by the appended claims and their equivalents.

The invention claimed is:

1. A photovoltaic cell comprising a silicon wafer bearing a back contact, the back contact comprising a passivation layer partially coated with a fired-through back side paste, wherein, prior to firing, the paste comprises
    a. about 40 to about 80 wt % aluminum,
    b. about 0.1 to about 50 wt % of silver,
    c. about 0.5 to about 10 wt % glass, and
    d. about 15 to about 40 wt % of an organic vehicle and, wherein no greater than about 10% of the area of the back contact is coated with the fired back side paste.

2. The photovoltaic cell of claim 1, wherein the aluminum paste further comprises at least one other metal selected from the group consisting of palladium, platinum, gold, boron, gallium, indium, zinc, tin, antimony, magnesium, potassium, titanium, vanadium, nickel, copper, and combinations thereof.

3. The photovoltaic cell of claim 1, wherein the back side paste comprises, prior to firing,
    a. about 60 to about 80 wt % aluminum
    b. about 0.5 to about 8 wt % glass,
    c. about 1 to about 25 wt % silver, and
    d. about 15 to about 40 wt % of an organic vehicle.

4. A photovoltaic cell comprising a silicon wafer bearing a back contact, the back contact comprising a passivation layer partially coated with a fired-through back side paste, wherein, prior to firing, the paste comprises
    a. about 40 to about 80 wt % aluminum
    b. about 1 to about 50 wt % copper,
    c. about 0.5 to about 10 wt % glass, and
    d. about 15 to about 40 wt % of an organic vehicle, and wherein no greater than about 10% of the area of the back contact is coated with the fired back side paste.

5. The photovoltaic cell of claim 4, wherein the back side paste comprises, prior to firing,
    a. about 60 to about 80 wt % aluminum
    b. about 0.5 to about 8 wt % glass,
    c. about 3 to about 15 wt % copper, and
    d. about 15 to about 40 wt % of an organic vehicle.

6. A photovoltaic cell comprising a silicon wafer bearing a back contact, the back contact comprising a passivation layer partially coated with a fired-through back side paste, wherein, prior to firing, the paste comprises
    a. about 40 to about 80 wt % aluminum,
    b. about 1 to about 50 wt % nickel,
    c. about 1 to about 50 wt % copper,
    d. about 0.5 to about 10 wt % glass, and
    e. about 15 to about 40 wt % of an organic vehicle, and wherein no greater than about 10% of the area of the back contact is coated with the fired back side paste.

7. A photovoltaic cell comprising a silicon wafer bearing a back contact, the back contact comprising a passivation layer partially coated with a fired-through back side paste, wherein, prior to firing, the paste comprises
    a. about 40 to about 80 wt % aluminum
    b. about 1 to about 50 wt % magnesium,
    c. about 0.5 to about 10 wt % glass, and
    d. about 15 to about 40 wt % of an organic vehicle, and wherein no greater than about 10% of the area of the back contact is coated with the fired back side paste.

8. The photovoltaic cell of claim 1, wherein the glass component comprises at least one of lead and cadmium.

9. The photovoltaic cell of claim 1, wherein the glass component is substantially devoid of lead and cadmium.

10. The photovoltaic cell of claim 1, wherein the aluminum paste further comprises ceramic particles selected from the group consisting of $SiO_2$, ZnO, MgO, $ZrO_2$, $TiO_2$, $Al_2O_3$, PbO, $Bi_2O_3$, $V_2O_5$, $MoO_3$, $WO_3$, $Sb_2O_3$, SnO, $In_2O_3$, hectorite, talc, kaolin, attapulgite, bentonite, smectite, quartz, mica, feldspar, albite, orthoclase, anorthite, silica, and combinations thereof.

11. A photovoltaic cell comprising:
    a. a fired front contact comprising, prior to firing,
        i. a passivating layer onto which is applied
        ii. a silver paste comprising,
            1. silver,
            2. a glass component, and
            3. a vehicle, and
    b. a fired back contact comprising, prior to firing,
        i. a passivating layer onto which is applied
        ii. an aluminum paste comprising,
            1. aluminum,
            2. a glass component, and
            3. a vehicle,
wherein no greater than about 10% of the area of the back contact is coated with the fired aluminum paste.

12. A solar cell including a back contact, wherein the back contact comprises a fired-through paste, which comprises, prior to firing, a thick film paste composition comprising about 40 to about 80 wt % aluminum and about 0.1 to about 50 wt % silver, wherein no greater than about 10% of the area of the back contact is coated with the fired paste.

* * * * *